(12) United States Patent
Lee

(10) Patent No.: US 6,495,448 B1
(45) Date of Patent: Dec. 17, 2002

(54) DUAL DAMASCENE PROCESS

(75) Inventor: Shyh-Dar Lee, Hsinchu Hsien (TW)

(73) Assignee: Silicon Integrated Systems Corp., Hsin Chu (TW)

(*) Notice: Subject to any disclaimer, the term of this patent is extended or adjusted under 35 U.S.C. 154(b) by 0 days.

(21) Appl. No.: 10/165,794

(22) Filed: Jun. 7, 2002

(51) Int. Cl.$^7$ .......................................... H01L 21/4763
(52) U.S. Cl. ...................... 438/624; 438/637; 438/638; 438/666; 438/672; 438/687
(58) Field of Search .................. 438/624, 637–638, 438/672, 666, 687

(56) References Cited

U.S. PATENT DOCUMENTS

| | | | | |
|---|---|---|---|---|
| 5,916,823 A | * | 6/1999 | Lou et al. ................... | 438/637 |
| 6,153,528 A | * | 11/2000 | Lan ............................ | 438/687 |
| 6,197,681 B1 | * | 3/2001 | Liu et al. .................... | 438/637 |
| 6,331,479 B1 | * | 12/2001 | Li et al. ..................... | 438/687 |
| 6,362,301 B1 | * | 12/2001 | Venkatesan et al. ........ | 438/638 |

* cited by examiner

Primary Examiner—John F. Niebling
Assistant Examiner—Lynne Gurley
(74) Attorney, Agent, or Firm—Merchant & Gould

(57) ABSTRACT

A process for fabricating a dual damascene structure. First, a substrate having a dielectric layer is provided. A cap layer and a mask layer with at least one trench pattern are sequentially formed on the dielectric layer. Thereafter, a photoresist layer with at least one via pattern aligned with the trench pattern is formed overlaying the mask layer and part of the cap layer. Next, the via pattern is transferred into the cap layer and the upper half of the dielectric layer. The photoresist layer is then removed. Subsequently, the trench pattern is transferred into the cap layer and the upper half of the dielectric layer, and simultaneously the via pattern in the upper half of the dielectric layer is transferred into the lower half of the dielectric layer. Finally, the trench and the via in the dielectric layer are filled with a conductive layer.

16 Claims, 5 Drawing Sheets

DUAL DAMASCENE PROCESS

BACKGROUND OF THE INVENTION

1. Field of the Invention

The present invention relates in general to the manufacture of semiconductor integrated circuits. More particularly, it relates to a dual damascene process for preventing photoresist contamination.

2. Description of the Related Art

In the semiconductor industry, much effort is spent developing semiconductor devices with high operating speeds. Due to rapid progress in integrated circuit (IC) fabrication technologies, the integration of the IC devices has increased, and raising the resistance of metal wires and the parasitic capacitance effect therebetween. The metal wires thus carry a current flow at a low speed. In order to reduce resistance and parasitic capacitance, low resistance material, such as copper, is used for metal wires, and low dielectric constant (low-k) materials are used for the insulating layer between the metal wires.

Recently, a dual damascene process using low-k dielectrics and low resistance metals has been developed to form high-reliability, low cost interconnects in the IC devices. FIGS. 1a though 1d illustrate a conventional method for forming a dual damascene structure. In FIG. 1a, a semiconductor substrate 100 is provided. A sealing layer 102, a low-k dielectric layer 104, and a mask layer 106 with a plurality of trench openings 106a are sequentially formed on the substrate 100.

In FIG. 1b, a photoresist layer 108 has been coated on the mask layer 106 and filled into the openings 106a. Next, lithography is performed on the photoresist layer 108, thereby forming a patterned photoresist layer 108 with a plurality of via openings 108a aligned with the trench openings 106a overlaying the mask layer 106 and part of the dielectric layer 104. Hence, however, photoresist contamination occurs due to amino elements in the dielectric layer 104. As a result, sidewalls of the patterned photoresist layer 108 have poor profile.

In FIG. 1c, the dielectric layer 104 is anisotropically etched using the patterned photoresist layer 108 as a mask, and the via pattern is then transferred into the upper half of the dielectric layer 104.

In FIG. 1d, the photoresist layer 108 is removed. Thereafter, the dielectric layer 104 is etched using the mask layer 106 with trench openings 106a, and using the sealing layer 102 as an etching stop layer. As a result, trench patterns are transferred into the upper half of the dielectric layer 104, and the via patterns in the upper half of the dielectric layer 104 are simultaneously transferred into the lower half of the dielectric layer 104. These trenches 104b and vias 104a formed in the dielectric layer 104 create a plurality of dual damascene structures. Next, the sealing layer 102 below the vias 104a is removed. Due to photoresist contamination mentioned above, a poor via profile in dual damascene structure results, and low IC device reliability results.

SUMMARY OF THE INVENTION

Accordingly, an object of the invention is to provide a dual damascene process for forming an additional cap layer on the dielectric, thereby preventing potentially contaminating photoresist contact with the dielectric layer.

Another object of the invention is to provide a dual damascene process for forming a cap layer as an anti-reflective layer (ARL) to improve the dual damascene structure profile.

To achieve these and other advantages, the invention provides a method of fabricating a dual damascene structure. First, a substrate having a dielectric layer is provided. A cap layer is formed on the dielectric layer, and a mask layer with at least one trench pattern is then deposited overlaying the cap layer. Thereafter, a photoresist layer with at least one via pattern aligned with the trench pattern is formed overlaying the mask layer and part of the cap layer. Next, the via pattern is transferred into the cap layer and the upper half of the dielectric layer. The photoresist layer is then removed. Subsequently, the trench pattern is transferred into the cap layer and the upper half of the dielectric layer, and simultaneously the via pattern in the upper half of the dielectric layer is transferred into the lower half of the dielectric layer. Finally, the trench and the via in the dielectric layer are filled with a conductive layer. In the invention, the cap layer is undoped silicate glass (USG), SiC or SiF, and chemical vapor deposition (CVD) using $SiH_4$ or tetraethyl orthosilicate (TEOS) as a reaction gas.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

FIGS. 2a through 2f illustrate a method for forming a dual damascene structure according to the present invention.

Figure 1A:
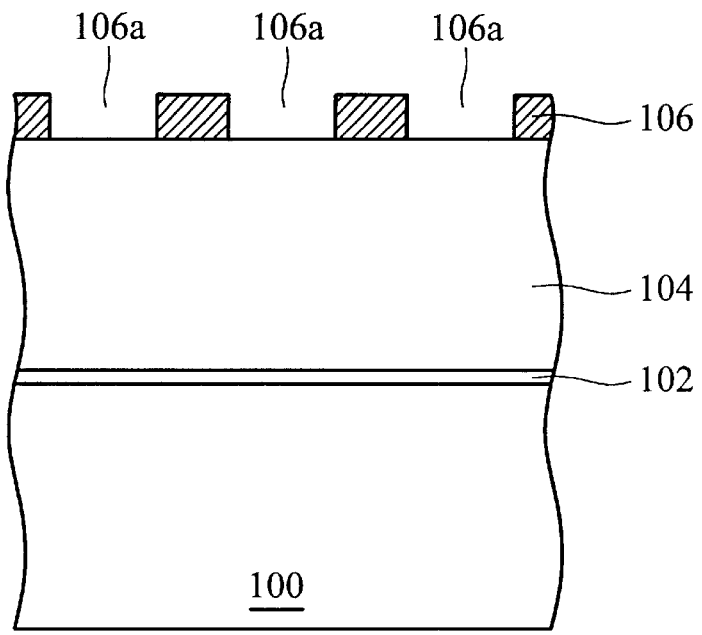
FIGS. 1a through 1d are sectional diagrams showing a conventional method for forming a dual damascene structure.
Figure 1B:
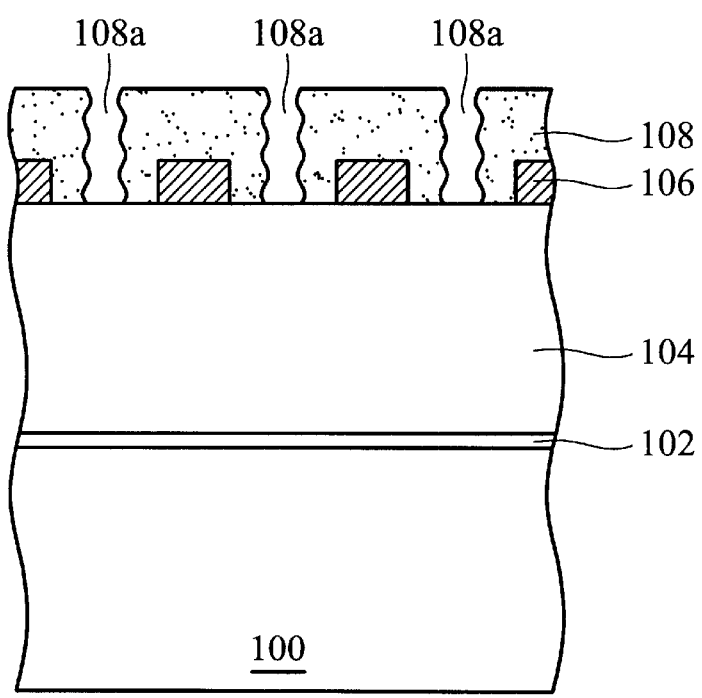
Figure 1C:
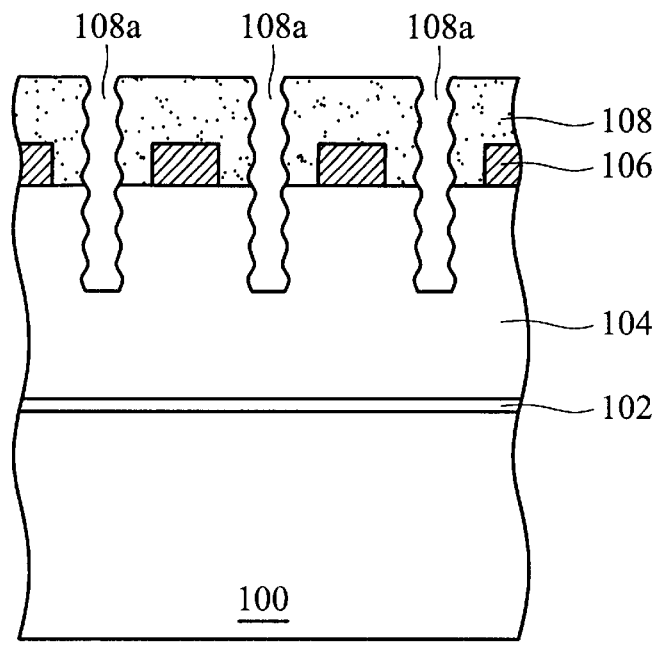
Figure 1D:
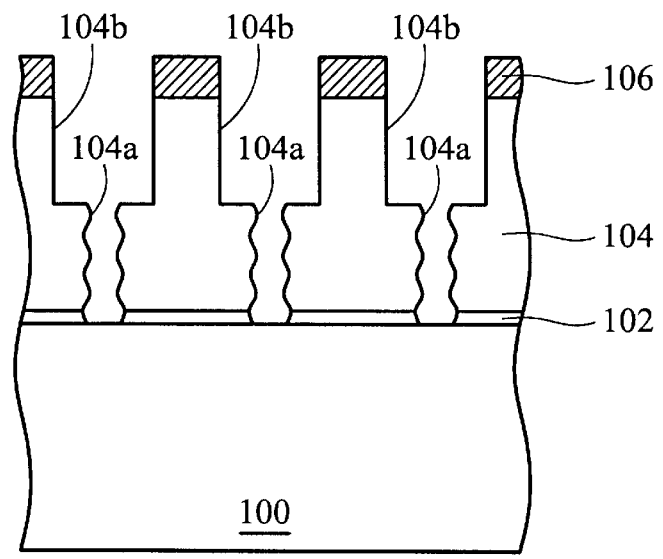
Figure 2A:
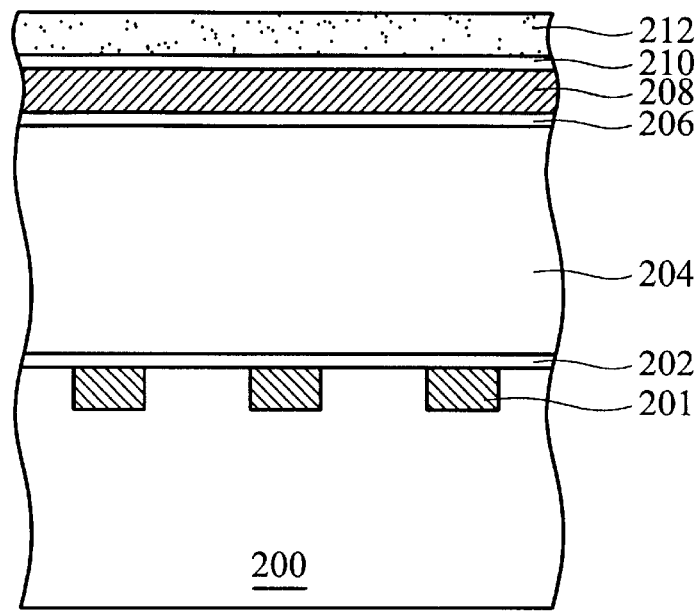
FIGS. 2a through 2f are sectional diagrams showing a method for forming a dual damascene structure according to the present invention.

In FIG. 2a, a semiconductor substrate 200 includes a plurality of metal wires 201, such as copper wires, is provided. A sealing layer 202 is covered on the substrate 200, and a dielectric layer 204, which serves as an intermetal dielectric (IMD), is then deposited on the sealing layer 202. The sealing layer 202 is used to prevent metal wires 201 from oxidization and the atoms/ions in the metal wires 201 from diffusing into the dielectric layer 204. In the invention, the sealing layer 202 is preferably silicon nitride (SiN) or silicon carbide (SiC), and the dielectric layer 204 is preferably a low-k material, such as black diamond (BD), Coral, Aurora and GreenDot.

Thereafter, a cap layer 206, a mask layer 208, and a photoresist layer 212 are sequentially formed on the dielectric layer 204. In the invention, the cap layer 206 is undoped silicate glass (USG), SiC or SiF, with thickness about 300~1500 angstroms. The cap layer 204 can be chemical vapor deposition (CVD) using $SiH_4$ or tetraethyl orthosilicate (TEOS) as a reaction gas. The mask layer 208 having a thickness of about 800~1200 angstroms serves as a hard mask to define trench patterns for dual damascene process, and preferably SiN. In addition, an anti-reflective layer (ARL) 210 having a thickness of about 200~400 angstroms may optionally be formed on the mask layer 208. Preferably, the ARL 210 is silicon oxynitride.

Figure 2B:
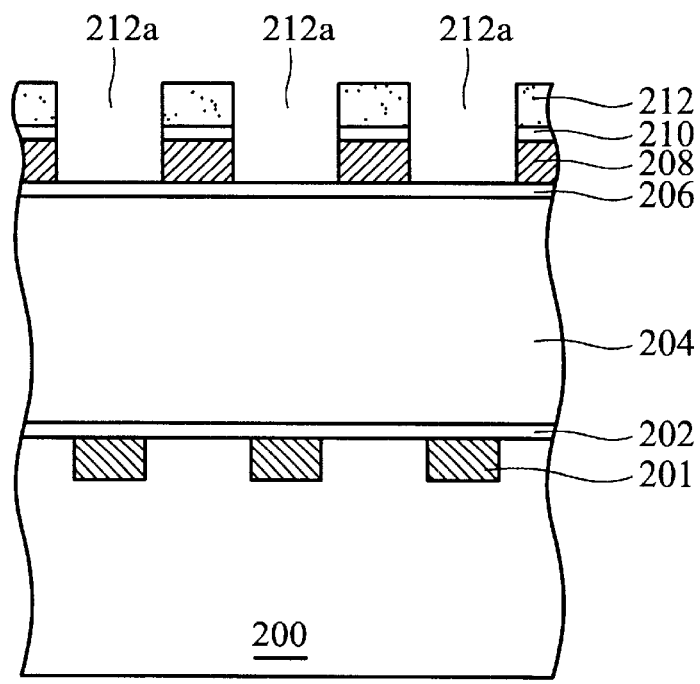

In FIG. 2b, lithography is performed on the photoresist layer 212 to form a plurality of trench openings 212a. Subsequently, the ARL 210 and the underlying mask layer 208 are anisotropically etched using the patterned photoresist layer 212 as a mask and using the cap layer 206 as an etching stop layer. As a result, the trench patterns are transferred into the mask layer 208.

Figure 2C:
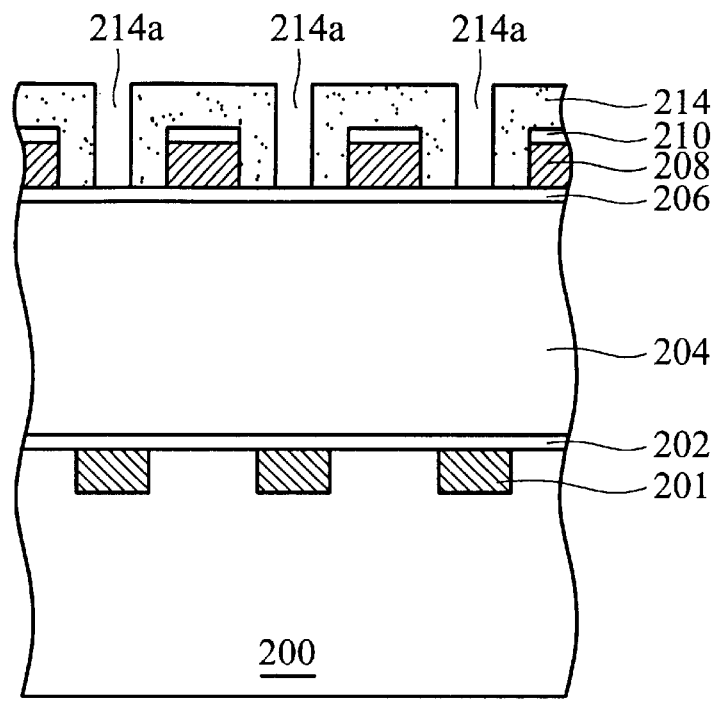

In FIG. 2c, the patterned photoresist layer 212 is removed. Thereafter, a photoresist layer 214 is coated on the ARL 210 and fills the openings 212a. Next, lithography is performed on the photoresist layer 214, thereby forming a patterned photoresist layer 214 with a plurality of via openings 214a aligned with the trench patterns overlaying the ARL 210 and part of the cap layer 206.

Figure 2D:
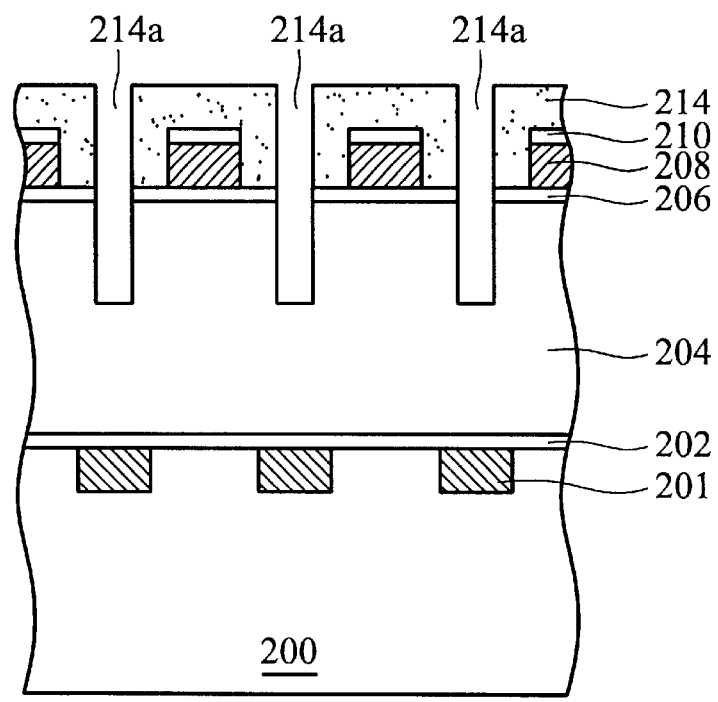

In FIG. 2d, the cap layer 206 and the dielectric layer 204 underlying the via openings 214a is anisotropically etched using the patterned photoresist layer 214 as a mask, and the via patterns are then transferred into the cap layer 206 and the upper half of the dielectric layer 204. In this invention, since the cap layer 206 is formed between the mask layer 208 and the dielectric layer 204, the photoresist layer 214 cannot directly contact the dielectric layer 204 so as to prevent the photoresist contamination. Moreover, since the cap layer 206 may be used for an anti-reflective layer, the standing wave effect and reflective notching can be avoided.

Figure 2E:
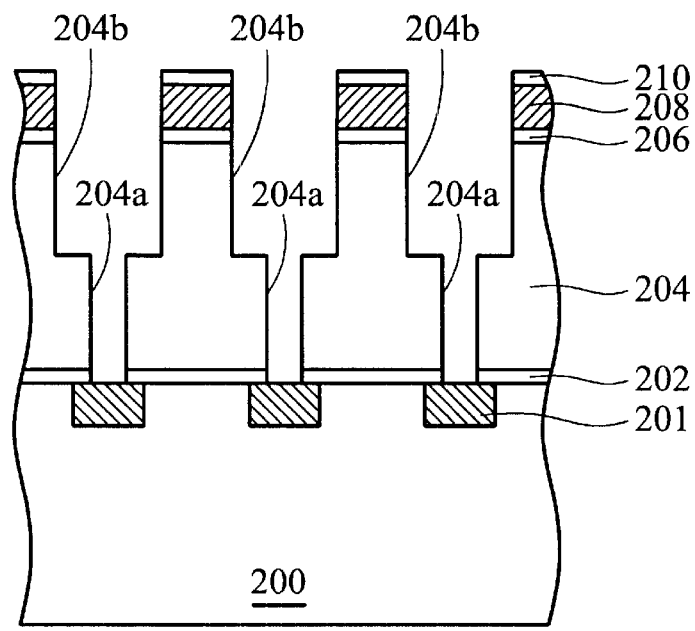

In FIG. 2e, the photoresist layer 214 is removed by oxygen plasma ($O_2$ plasma). Also, the cap layer 206 can protect the dielectric layer 204 without damage by $O_2$ plasma. Thereafter, part of the cap layer 206 and the underlying dielectric layer 204 are etched using the mask layer 208 with a trench pattern, which is covered by the ARL 210, as a hard mask, and using the sealing layer 202 as an etching stop layer. As a result, the trench patterns are transferred into the cap layer 206 and the upper half of the dielectric layer 204, and the via patterns in the upper half of the dielectric layer 204 are simultaneously transferred into the lower half of the dielectric layer 204. These trenches 204b and vias 204a formed in the dielectric layer 204 create a plurality of dual damascene structures. Next, the sealing layer 202 below the vias 204a is removed to expose the metal wires 201 underlying the vias 204a.

Figure 2F:
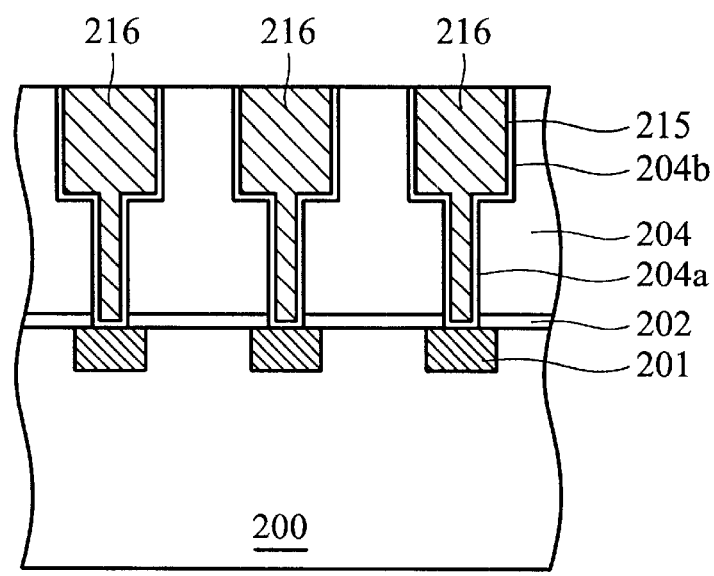

In FIG. 2f, the patterned ARL 210, patterned mask layer 208, and the patterned cap layer 206 are sequentially removed to expose the surface of the dielectric layer 204 having the trenches 204b and the vias 204a. Next, a conformal metal barrier layer 215 is deposited on the dielectric layer 204 and sidewalls of the trenches 204b and vias 204a. Preferably, the metal barrier layer 215 is titanium (Ti), tantalum (Ta), titanium nitride (TiN) or tantalum nitride (TaN). Also, the metal barrier layer 215 prevents the atoms/ions in the metal (not shown) from diffusing into the dielectric layer 204 in subsequent metallization. Thereafter, a conductive layer 216, such as coper layer, has been deposited on the dielectric layer 204 and filled the trenches 204b and the vias 204a in the dielectric layer 204 to connect to the metal wires 201. Next, the excess metal layer 215 is polished back to the dielectric layer 204 by chemical mechanical polishing (CMP) to form metal interconnects in the dielectric layer 204.

Compared to the conventional method of forming the dual damascene structure, the present invention forms an additionally cap layer 206 to block the dielectric layer 204 contacted to the photoresist layer 214. Accordingly, the photoresist contamination can be prevented, and the profile of the dual damascene structure can be improved. That is, IC devices with high reliability can be obtained.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of fabricating a dual damascene structure, comprising the steps of:

providing a substrate having a dielectric layer;

forming a cap layer on the dielectric layer;

forming a mask layer with at least one trench pattern overlaying the cap layer;

forming a photoresist layer with at least one via pattern aligned with the trench pattern overlaying the mask layer and part of the cap layer;

transferring the via pattern into the cap layer and the upper half of the dielectric layer;

removing the photoresist layer;

transferring the trench pattern into the cap layer and the upper half of the dielectric layer, and simultaneously transferring the via pattern in the upper half of the dielectric layer into the lower half of the dielectric layer; and filling the trench and the via in the dielectric layer with a conductive layer.

2. The method as claimed in claim 1, wherein the substrate comprises a metal wire underlying the via formed in the dielectric layer.

3. The method as claimed in claim 2, wherein the substrate comprises a sealing layer covered on the metal wire.

4. The method as claimed in claim 2, wherein the metal wire is copper.

5. The method as claimed in claim 3, wherein the sealing layer is silicon nitride or silicon carbide.

6. The method as claimed in claim 1, wherein the mask layer comprises an anti-reflective layer.

7. The method as claimed in claim 6, wherein the anti-reflective layer is silicon oxynitride.

8. The method as claimed in claim 1, further comprising:

removing the mask layer and the cap layer to expose the surface of the dielectric layer having the trench and via; and forming a conformal metal barrier layer on the dielectric layer.

9. The method as claimed in claim 8, wherein the metal barrier layer is Ti, Ta, TiN or TaN.

10. The method as claimed in claim 1, wherein the dielectric layer is a low-k material.

11. The method as claimed in claim 1, wherein the cap layer is undoped silicate glass, SiC or SiF.

12. The method as claimed in claim 11, wherein the cap layer is formed by chemical vapor deposition using $SiH_4$ as a reaction gas.

13. The method as claimed in claim 11, wherein the cap layer is chemical vapor deposition using tetraethyl orthosilicate as a reaction gas.

14. The method as claimed in claim 11, wherein the cap layer has a thickness of 300~1500 angstroms.

15. The method as claimed in claim 1, wherein the mask layer is silicon nitride.

16. The method as claimed in claim 1, wherein the conductive layer is copper.

* * * * *